(12) United States Patent
Park et al.

(10) Patent No.: US 11,977,338 B2
(45) Date of Patent: May 7, 2024

(54) DEFOCUS MEASUREMENT METHOD, CORRECTION METHOD, AND METHOD OF MANUFACTURING SEMICONDUCTOR DEVICE BY USING THE CORRECTION METHOD

(71) Applicant: SAMSUNG ELECTRONICS CO., LTD., Suwon-si (KR)

(72) Inventors: Jieun Park, Seoul (KR); Youngmin Seo, Suwon-si (KR); Inbeom Yim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 347 days.

(21) Appl. No.: 17/340,267

(22) Filed: Jun. 7, 2021

(65) Prior Publication Data

US 2022/0128911 A1    Apr. 28, 2022

(30) Foreign Application Priority Data

Oct. 28, 2020 (KR) .................. 10-2020-0141567

(51) Int. Cl.
*G03F 7/00* (2006.01)
*H01L 21/66* (2006.01)

(52) U.S. Cl.
CPC ...... *G03F 7/70641* (2013.01); *G03F 7/70683* (2013.01); *H01L 22/20* (2013.01)

(58) Field of Classification Search
None
See application file for complete search history.

(56) References Cited

U.S. PATENT DOCUMENTS

| 6,701,512 B2 | 3/2004 | Sutani et al. |
| 8,339,595 B2 | 12/2012 | Den Boef |
| 9,529,253 B2 | 12/2016 | Tyminski et al. |
| 9,557,655 B2 | 1/2017 | Kim et al. |
| 10,488,763 B2 | 11/2019 | Tyminski |

(Continued)

FOREIGN PATENT DOCUMENTS

| KR | 10-0595331 B1 | 6/2006 |
| KR | 10-0615815 B1 | 8/2006 |

(Continued)

OTHER PUBLICATIONS

Jiarui Hu, Y. L. et al., "Improving focus performance at litho using diffraction-based focus metrology, novel calibration methods, interface, and control loop," Proc. SPIE 9778, Metrology, Inspection, and Process Control for Microlithography XXX, 977829 (Mar. 8, 2016); (Year: 2016).*

(Continued)

*Primary Examiner* — Cory W Eskridge
(74) *Attorney, Agent, or Firm* — Fish & Richardson P.C.

(57) ABSTRACT

A method of manufacturing a semiconductor device includes selecting a diffraction based focus (DBF) mark that is unaffected by a pattern of a lower layer; manufacturing a mask including a mark pattern for forming the DBF mark; forming the DBF mark in a cell region of a wafer by using the mask; measuring the DBF mark and monitoring defocus; correcting the defocus on the basis of a result of the monitoring; and forming a pattern in the cell region of the wafer, after correcting the defocus.

20 Claims, 27 Drawing Sheets

(56) References Cited

U.S. PATENT DOCUMENTS

| | | | | |
|---|---|---|---|---|
| 2002/0021434 | A1* | 2/2002 | Nomura | G03F 7/706 |
| | | | | 430/30 |
| 2007/0108368 | A1* | 5/2007 | Mieher | B22D 11/064 |
| | | | | 430/30 |
| 2008/0018874 | A1* | 1/2008 | Dusa | G03F 7/70625 |
| | | | | 355/55 |
| 2019/0049373 | A1* | 2/2019 | Levinski | G03F 7/70683 |
| 2019/0155174 | A1* | 5/2019 | Kim | G06T 7/001 |

FOREIGN PATENT DOCUMENTS

| | | |
|---|---|---|
| KR | 10-2008-0000124 A | 1/2008 |
| KR | 10-2102302 B1 | 4/2020 |

OTHER PUBLICATIONS

M. Ebert, P. Vanoppen, M. Jak, G. v. d. Zouw, H. Cramer, T. Nooitgedagt, H. v. d. Laan, "New approaches in diffraction based optical metrology," Proc. SPIE 9778, Metrology, Inspection, and Process Control for Microlithography XXX, 97782N (Mar. 24, 2016 ); https://doi.org/10.1117/12.2219946 (Year: 2016).*

Ben F. Noyes III, et al., "Applications of on-product diffraction-based focus metrology in logic high volume manufacturing," Proc. SPIE 9778, Metrology, Inspection, and Process Control for Microlithography XXX, 97782V (Mar. 8, 2016); https://doi.org/10.1117/12.2219303 (Year: 2016).*

Jan Mulkens, et al., "High order field-to-field corrections for imaging and overlay to achieve sub 20-nm lithography requirements," Proc. SPIE 8683, Optical Microlithography XXVI, 86831J (Apr. 12, 2013); https://doi.org/10.1117/12.2011550 (Year: 2013).*

Jan Mulkens, Paul C. Hinnen, Michael Kubis, Alexander V. Padiy, Jos P. Benschop, "Holistic optimization architecture enabling sub-14-nm projection lithography," J. Micro/Nanolith. MEMS MOEMS 13(1) 011006 (Jan. 7, 2014) https://doi.org/10.1117/1.JMM.13.1.011006 (Year: 2014).*

* cited by examiner

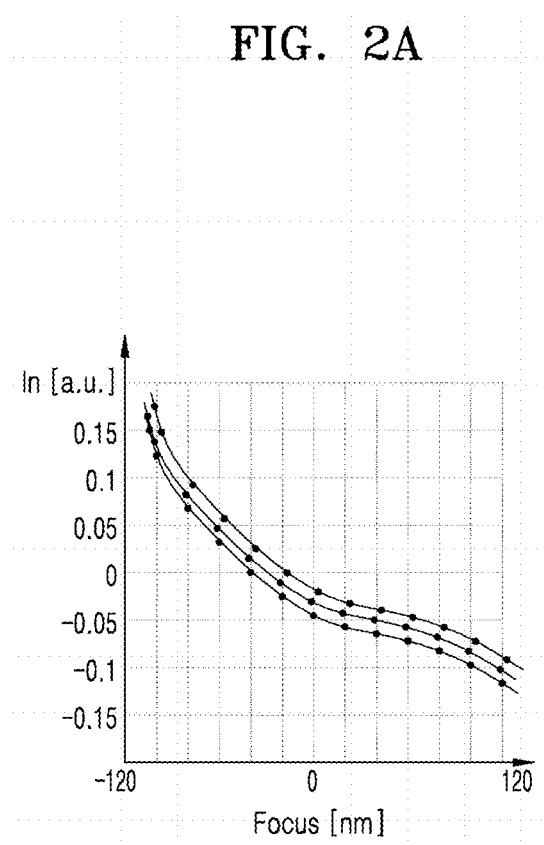

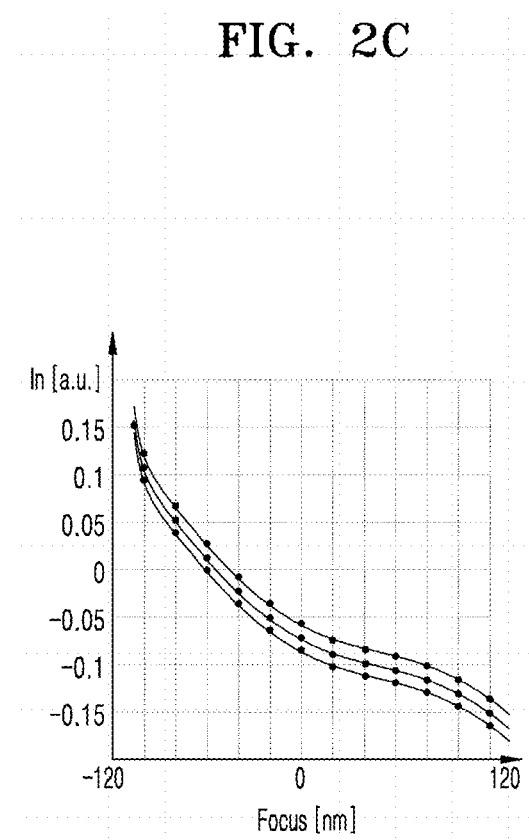

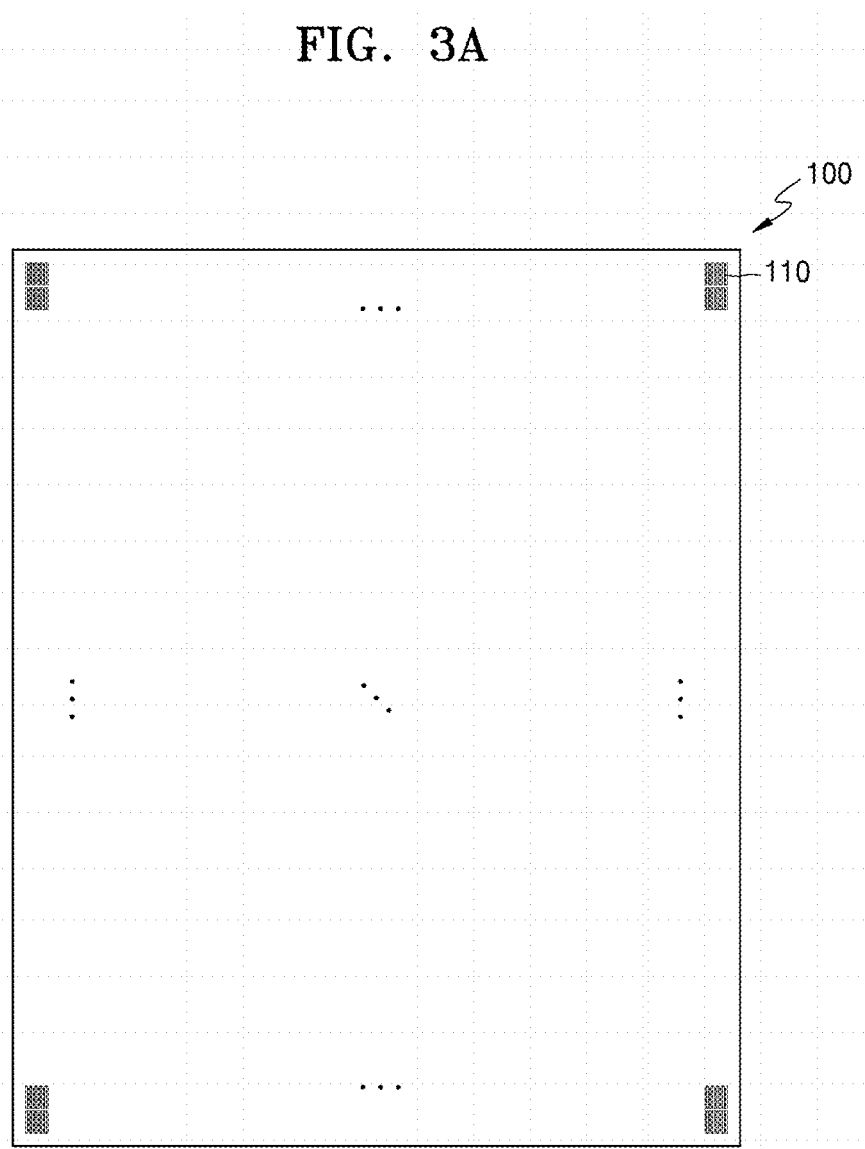

DEFOCUS MEASUREMENT METHOD, CORRECTION METHOD, AND METHOD OF MANUFACTURING SEMICONDUCTOR DEVICE BY USING THE CORRECTION METHOD

CROSS-REFERENCE TO RELATED APPLICATION

Korean Patent Application No. 10-2020-0141567, filed on Oct. 28, 2020 in the Korean Intellectual Property Office, and entitled: "Defocus Measurement Method, Correction Method, and Method of Manufacturing Semiconductor Device by Using the Correction Method," is incorporated by reference herein in its entirety.

BACKGROUND

1. Field

Embodiments relate to a semiconductor manufacturing exposure process, and more particularly, to the use of defocus measurement and correction to measure and correct a defocus state in an exposure process used to manufacture a semiconductor device.

2. Description of the Related Art

Recently, as semiconductor devices are highly integrated, various lithography technologies for forming a fine pattern have been developed. Also, various measurement technologies for measuring a lithography process of manufacturing an ultra-highly integrated device have been proposed.

SUMMARY

Embodiments are directed to a defocus measurement method, including: selecting a diffraction based focus (DBF) mark that is unaffected by a pattern of a lower layer; manufacturing a mask including a mark pattern for forming the DBF mark; forming the DBF mark in a cell region of a wafer by using the mask; and measuring the DBF mark and monitoring defocus.

Embodiments are also directed to a defocus correction method, including: selecting a diffraction based focus (DBF) mark that is unaffected by a pattern of a lower layer; manufacturing a mask including a mark pattern for forming the DBF mark; forming the DBF mark in a cell region of a wafer by using the mask; measuring the DBF mark and monitoring defocus; and correcting the defocus on the basis of a result of the monitoring.

Embodiments are also directed to a method of manufacturing a semiconductor device, the method including: selecting a diffraction based focus (DBF) mark that is unaffected by a pattern of a lower layer; manufacturing a mask including a mark pattern for forming the DBF mark; forming the DBF mark in a cell region of a wafer by using the mask; measuring the DBF mark and monitoring defocus; correcting the defocus on the basis of a result of the monitoring; and forming a pattern in the cell region of the wafer, after correcting the defocus.

BRIEF DESCRIPTION OF THE DRAWINGS

Features will become apparent to those of skill in the art by describing in detail example embodiments with reference to the attached drawings in which:

FIGS. 2A to 2C are graphs for describing an operation of selecting a diffraction based focus (DBF) mark in the defocus measurement method of FIG. 1;

FIGS. 3A to 3C are conceptual diagrams and cross-sectional views illustrating a mask used in an operation of manufacturing a mask, in the defocus measurement method of FIG. 1;

DETAILED DESCRIPTION

Figure 1:
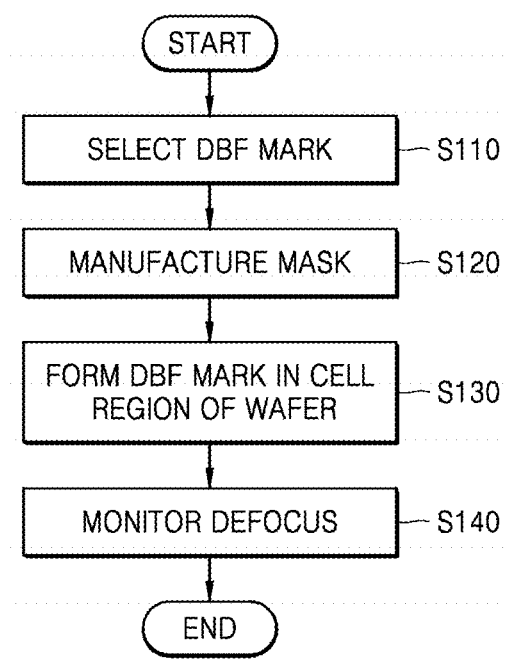
FIG. 1 is a flowchart schematically illustrating a defocus measurement method according to an example embodiment.
Figure 2B:
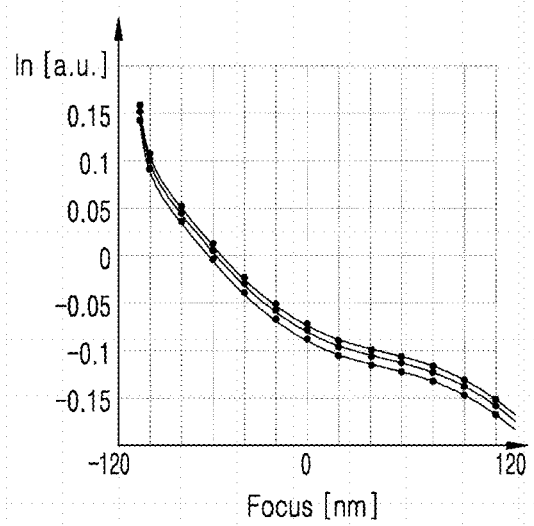
Figure 3B:
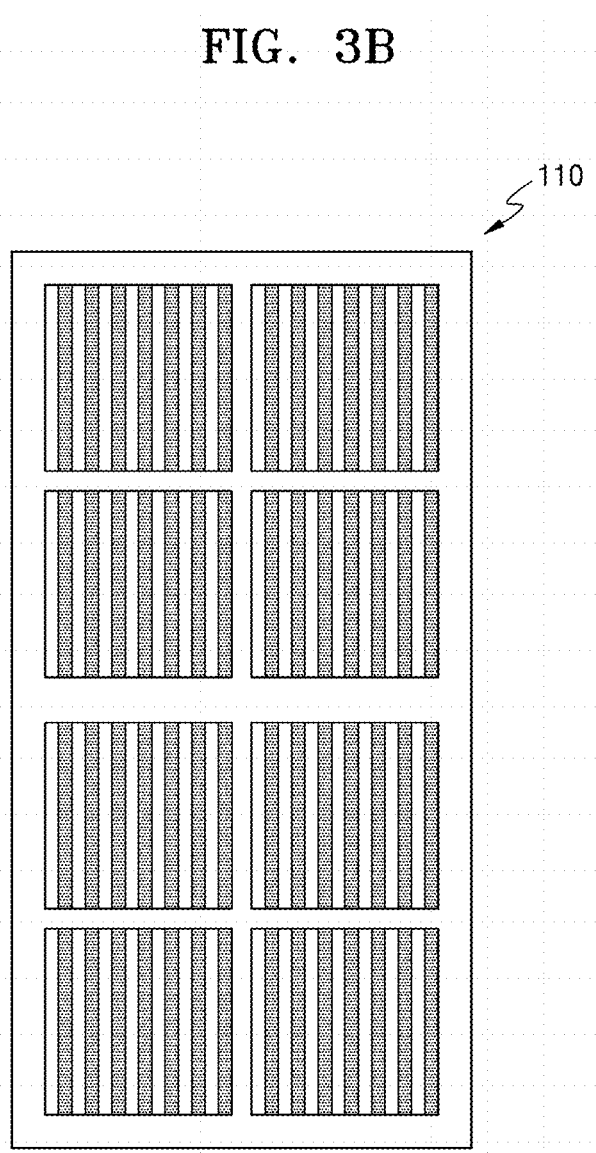
Figure 3C:
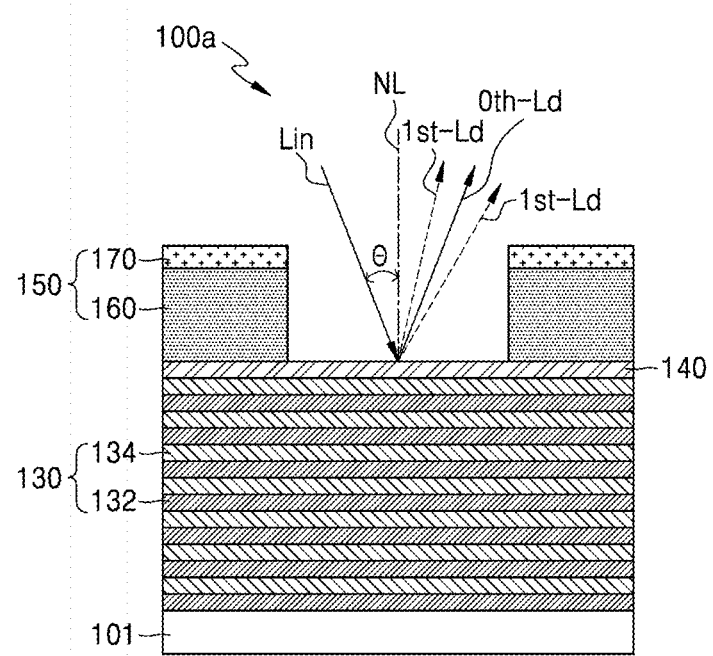
Figure 4A:
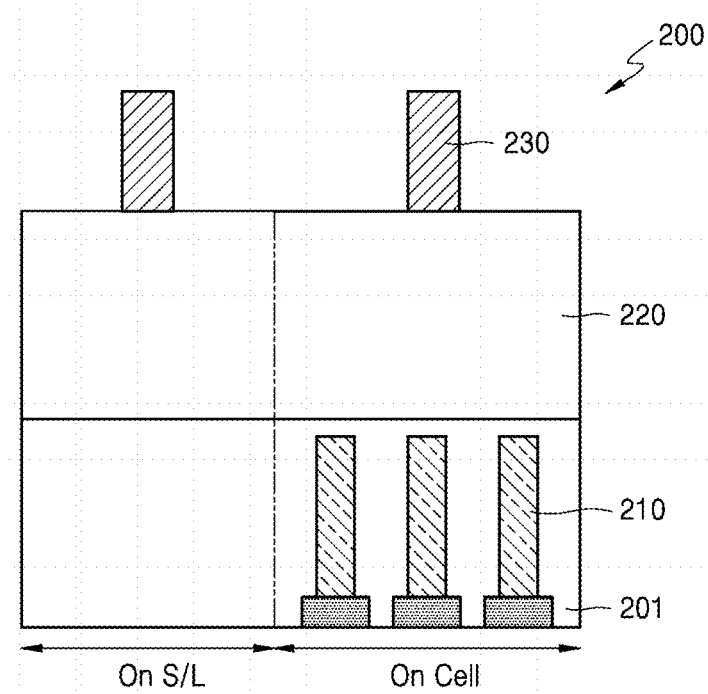
FIGS. 4A to 4C are cross-sectional views and photographs showing a shape of a DBF mark on a wafer in an operation of forming a DBF mark, in the defocus measurement method of FIG. 1.
Figure 4B:
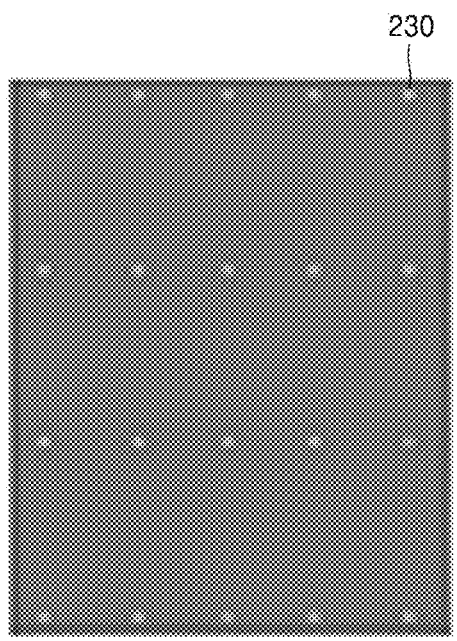
Figure 4C:
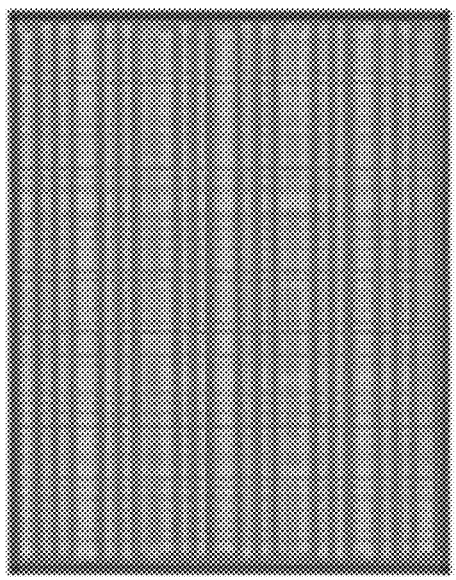
Figure 5A:
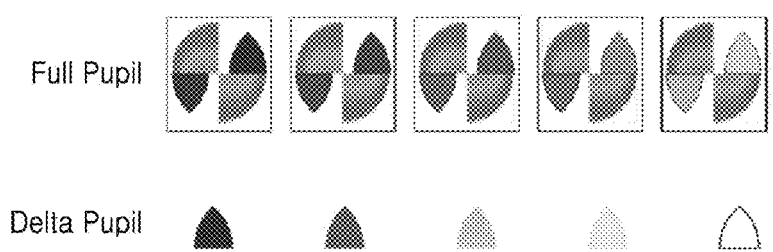
FIGS. 5A and 5B are photographs and graphs for describing an operation of monitoring defocus, in the defocus measurement method of FIG. 1.
Figure 5B:
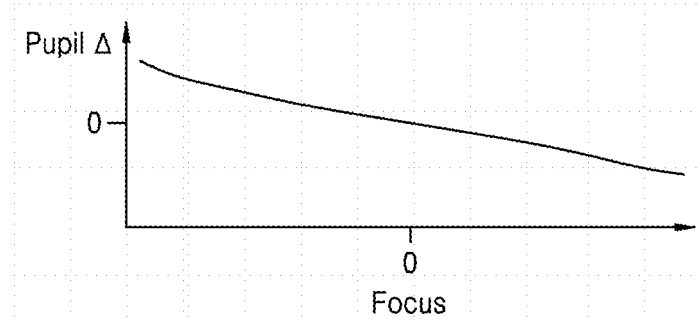

FIG. 1 is a flowchart schematically illustrating a defocus measurement method according to an example embodiment. FIGS. 2A to 2C are graphs for describing an operation of selecting a diffraction based focus (DBF) mark in the defocus measurement method of FIG. 1. FIGS. 3A to 3C are conceptual diagrams and cross-sectional views illustrating a mask used in an operation of manufacturing a mask, in the defocus measurement method of FIG. 1. FIGS. 4A to 4C are cross-sectional views and photographs showing a shape of a DBF mark on a wafer in an operation of forming a DBF mark, in the defocus measurement method of FIG. 1. FIGS. 5A and 5B are photographs and graphs for describing an operation of monitoring defocus, in the defocus measurement method of FIG. 1.

Referring to FIGS. 1 and 2A to 2C, a defocus measurement method according to an example embodiment may select a defocus measurement mark (i.e., a diffraction based focus mark or DBF mark to be formed on a wafer) in operation S110. The DBF mark may also be referred to as a DBF key. Also, the DBF mark may have a size of several μm to tens of μm, and thus, may be referred to as a micro DBF (uDBF) mark. The DBF mark may be formed on the wafer through an exposure process using a mask, and a measurement apparatus may measure the DBF mark on the wafer to measure defocus of a corresponding region. The measurement principle using a DBF mark may use an intensity difference of diffracted light (particularly, ±1$^{st}$-order diffracted light) as in the term "DBF mark". The measurement principle using a DBF mark will be described in more detail with reference to FIGS. 5A and 5B.

An optimal DBF mark for measuring defocus is not affected by a pattern of a lower layer or an underlying layer. Thus, ideally, in measurement performed on a DBF mark, intensity based on a focus position is identically shown regardless of the presence of a pattern of a lower layer.

In measurements performed on a DBF mark, intensity graphs based on a focus position have to be shown in a first-order (linear) or third-order (cubic) graph shape having substantially the same curve shape, regardless of the presence of a pattern of a lower layer.

In further detail, the graphs of FIGS. 2A to 2C were obtained by measuring a DBF mark on the basis of three different doses.

In the graphs of FIGS. 2A to 2C, the x axis represents a focus position, a unit is nm, and 0 may correspond to an in-focus position.

In the graphs of FIGS. 2A to 2C, the y axis represents intensity obtained by measuring a DBF mark, and a unit may be an arbitrary unit. Here, the intensity obtained by measuring the DBF mark may denote an intensity difference of ±1$^{st}$-order diffracted light of the DBF mark. However, according to an example embodiment, intensity obtained by measuring a DBF mark may be used instead of an intensity difference of ±1$^{st}$-order diffracted light of the DBF mark.

FIG. 2A is a graph obtained by measuring a DBF mark with respect to a wafer where a lower layer does not have a pattern. FIG. 2B is a graph obtained by measuring a DBF mark with respect to a wafer where a lower layer has a pattern and the pattern is covered by a high temperature film. FIG. 2C is a graph obtained by measuring a DBF mark with respect to a wafer where a lower layer has a pattern and the pattern is covered by a medium temperature film.

As seen in the graphs of FIGS. 2A to 2C, it may be seen that graphs are shown in a cubic graph shape having similar curves. Therefore, a corresponding DBF mark, which has been measured, may be selected as a mark for defocus measurement.

Referring to FIGS. 1 and 3A to 3C, after the DBF mark is selected, a mask 100 for forming the DBF mark may be manufactured in operation S120. Thus, the mask 100 including a mark pattern 110 that forms the DBF mark may be manufactured.

In the defocus measurement method according to an example embodiment, the DBF mark may be formed in a cell region of a wafer, and defocus of the cell region may be measured and monitored using the DBF mark. Therefore, the DBF mark may be referred as an on-cell focus monitoring (OCFM) mark. The mark pattern 110 (which forms the DBF mark) may be formed in a first region of the mask 100, the first region of the mask 100 corresponding to the cell region of the wafer.

The cell region may be a region of the wafer where a plurality of real patterns or actual patterns are formed. Also, the cell region may be subdivided into a memory or logic cell region, a peri region, an extension region, and a row-decoder (X-dec) region. The memory or logic cell region may denote a region of the wafer where a plurality of memory devices or logic devices are arranged in a two-dimensional (2D) array structure. The peri region may denote a region of the wafer where a plurality of circuits for driving a memory device or a logic device are disposed. The extension region may denote a region of the wafer where a plurality of contacts for connecting the memory device or the logic device to a word line are disposed. The row decoder (X-dec) region may denote a region of the wafer where a row decoder applying a voltage to the word line is disposed.

According to an example embodiment, the DBF mark may be formed in a scribe lane (S/L) region of the wafer. In this case, the mark pattern 110 corresponding to the DBF mark may be formed in a second region of the mask 100, the second region of the mask 100 corresponding to the S/L region of the wafer.

Thus, according to an example embodiment, the DBF mark may be formed in only the cell region of the wafer, or may be formed in both of the cell region and the S/L region of the wafer. Correspondingly, the mark pattern 110 may be formed in only the first region of the mask 100 (which corresponds to the cell region of the wafer), or may be formed in both of the first region of the mask 100 (which corresponds to the cell region of the wafer) and the second region of the mask 100 (which corresponds to the S/L region of the wafer).

In the defocus measurement method according to the present example embodiment, tens of thousands to millions of DBF marks may be formed in the cell region of the wafer with respect to one exposure shot. Correspondingly, a plurality of mark patterns 110 corresponding to the tens of thousands to millions of DBF marks may be formed in the mask 100.

In further detail, FIG. 3A is a conceptual diagram of a mask 100 where a plurality of mark patterns 110 corresponding to DBF marks are disposed, and FIG. 3B is a conceptual diagram illustrating the enlargement of one mark pattern 110 of the mask 100 of FIG. 3A.

Tens of thousands to millions of mark patterns 110 (each corresponding to a DBF mark) may be formed and disposed in the mask 100 of FIG. 3A. As a detailed example, when a size of the mask 100 is about 26 mm in width and about 33 mm in length and a size of one mark pattern 110 is about 20*40 μm$^2$, 1,300 mark patterns 110 may be disposed in width and 825 mark patterns 110 may be disposed in length in the mask 100, and thus, a total of 1,072,500 mark patterns 110 may be disposed in the mask 100. However, the number of mark patterns 110 disposed in the mask 100 is not limited to this numerical value. For example, the number of mark patterns 110 disposed in the mask 100 may be variously changed based on a size of the mask 100 and a size of the mark pattern 110.

As described above, in the defocus measurement method according to an example embodiment, because a DBF mark is formed in a cell region of a wafer, a mark pattern 110 corresponding to a DBF mark may be formed in the first region of the mask 100 corresponding to the cell region.

An area of the cell region of the wafer may be much greater than an area of the S/L region of the wafer, and thus an area of first region of the mask 100 (corresponding to the cell region of the wafer) may be much greater than an area of the second region of the mask 100 (corresponding to the S/L region of the wafer). Thus, the number of DBF marks and mark patterns 110 corresponding thereto that are respectively formed in the cell region and the first region of the mask 100 may be much greater than the number of DBF marks and mark patterns 110 corresponding thereto that are respectively formed in the S/L region and the second region of the mask 100.

For reference, in a general defocus measurement method, a DBF mark may be formed in only an S/L region of a wafer. Because an area of an S/L region is low and a process condition (such as a certain lighting system and photoresist (PR) of a certain step) is be used, only a relatively small number of DBF marks is formed per shot, and thus an available range and a focus range of a DBF mark are limited. Therefore, the general defocus measurement method may not accurately represent a defocus state of a cell region. In other words, in the general defocus measurement method, the number of DBF marks used for measurement is very small, because the DBF marks are formed only in the S/L region), and thus defocus of another region of the wafer (e.g., the cell region) is predicted by measuring defocus of the S/L region. Therefore, when a step height variation occurs between an S/L region and a cell region or an error occurs in a level sensor, a measurement error of defocus of the cell region and a resultant erroneous correction (i.e., miscorrection) of defocus may occur. Also, the step height variation between the S/L region and the cell region may occur from wafer to wafer, or may occur from lot to lot.

On the other hand, in a defocus measurement method according to an example embodiment, tens of thousands to millions of DBF marks per shot may be formed in a cell region of a wafer. Therefore, defocus may be accurately measured based on the large number of DBF marks. Further, defocus may be directly measured in a cell region (rather than extrapolated or predicted from measurements in the S/L region), and thus a measurement error of defocus and abnormal correction of defocus may reduce or eliminated, e.g., in the case of the step height variation between the S/L region and the cell region or the error of the level sensor.

Furthermore, in a defocus measurement method according to an example embodiment, the mask 100 may be a dedicated mask for forming a DBF mark, and may be used in an exposure process performed on all semiconductor devices regardless of the kind of semiconductor devices. Thus, the mask 100 may be an available general-use mask regardless of the kinds of products, and may be used for all semiconductor products such as vertical NAND (VNAND) products, dynamic random access memory (DRAM) products, and logic products. Therefore, in the mask 100, a process condition such as PR and a lighting system may be freely selected in an exposure process, a focus range of a DBF mark may increase, and an available range of a DBF mark may be enlarged.

In the defocus measurement method according to an example embodiment, the mask 100 may be a transmissive mask, which is used for an ultraviolet (UV) or a deep UV (DUV) exposure process. However, in the defocus measurement method according to an example embodiment, the mask 100 is not limited to a transmissive mask. For example, the mask 100 may be a reflective mask, which is used for an extreme ultraviolet (EUV) exposure process.

FIG. 3C provides a more detailed illustration of a structure of a reflective mask 100a.

Referring to FIG. 3C, the reflective mask 100a may include a mask substrate 101, a multilayer 130, a capping layer 140, and an absorption layer 150.

The mask substrate 101 may include a low thermal expansion material (LTEM). For example, the mask substrate 101 may include silicon or quartz.

The multilayer 130 may include, e.g., a plurality of silicon layers 132 and molybdenum layers 134, which are alternately stacked.

The capping layer 140 may be formed on the multilayer 130, and may include, e.g., ruthenium (Ru).

The absorption layer 150 may be formed on the capping layer 140 and may include an absorption body 160 and an anti-reflective coating (ARC) layer 170. The absorption body 160 may be a layer which absorbs EUV light, and may include TaBN, TaN, tantalum (Ta), TiN, titanium (Ti), or lawrencium (Lr). However, a material of the absorption body 160 is not limited to the materials described above. The ARC layer 170 may prevent reflection of EUV light incident thereon.

As illustrated in FIG. 3C, the absorption layer 150 may be in the form of a pattern on the capping layer 140, and a pattern of the absorption layer 150 may represent a device pattern which is to be formed on a wafer. For example, a pattern of the absorption layer 150 may represent a gate line of a MOS transistor. However, a pattern represented by the pattern of the absorption layer 150 is not limited to the gate line of a MOS transistor.

In an EUV exposure process, incident EUV light (Lin) may be incident on the reflective mask 100a at a first incident angle ($\theta$) and may be reflected at the same reflection angle. Here, the first incident angle ($\theta$) may be about 6 degrees, and an incident angle and a reflection angle may be defined with respect to a normal line NL vertical to a top surface of the reflective mask 100a. In FIG. 3C, the normal line NL is illustrated by a one-dot dashed line. The EUV light Lin that is incident on the reflective mask 100a may be diffracted due to the pattern of the absorption layer 150, and diffracted light may include $0^{th}$-order diffracted light (0th-Ld, illustrated by a solid line in FIG. 3C) and $1^{st}$-order diffracted light (1st-Ld, illustrated by a dashed line in FIG. 3C). The diffracted light may include $2^{nd}$ or higher-order diffracted light (not shown).

Referring to FIGS. 1 and 4A to 4C, a mask 100 may be manufactured, and then, by using the mask 100, a DBF mark 230 may be formed in a cell region (denoted as On Cell in FIG. 4A) of a wafer 200 in operation S130. Thus, by using the mask 100 including a mark pattern 110, the DBF mark 230 may be formed in the cell region (On Cell) of the wafer 200 by transferring the mark pattern 110 to the wafer 200 through an exposure process. The wafer 200 may include the cell region (On Cell) and an S/L region (denoted as On S/L in FIG. 4A). In FIG. 4A, a partial cross-sectional surface of the wafer 200 corresponding to a portion at which the DBF mark 230 is formed is illustrated. As illustrated in FIG. 4A, in the cell region (On Cell), a pattern 210 may be on a lower layer 201, and a DBF mark 230 may be disposed on an upper layer 220 disposed on the pattern 210. In the S/L region (On S/L), a pattern may not be on the lower layer 201.

Also, according to an example embodiment (not shown), the DBF mark 230 may not be disposed in the S/L region (On S/L), e.g., the DBF mark 230 may not be formed on the upper layer 220 of the S/L region (On S/L).

FIG. 4B is a photograph showing a shape in which a plurality of DBF marks 230 are disposed in an S/L region (On S/L), in a region corresponding to one shot on a wafer. FIG. 4C is a photograph showing a shape in which a plurality of DBF marks 230 are disposed in a cell region (On Cell), in a region corresponding to one shot on a wafer.

For reference, in FIG. 4C, about a million of DBF marks 230 may be disposed in a region corresponding to one shot (in FIG. 4C, the DBF marks may not be differentiated from one another, and thus, may not be referred to by reference numerals). In FIG. 4B, 20 DBF marks 230 may be disposed in the S/L region (On S/L). However, the number of DBF marks 230 disposed in the S/L region (On S/L) is not limited thereto. Also, in FIG. 4C, a plurality of DBF marks 230 may be disposed in only the cell region (On Cell) and may be disposed in the S/L region (On S/L). However, as described above, according to an example embodiment, the DBF marks 230 may also be disposed in the S/L region (On S/L).

A process of forming the DBF mark 230 in the S/L region (On S/L) and/or the cell region (On Cell) of a wafer 200 may be performed by using an UV or DUV exposure process in a case where the mask 100 is a transmissive mask. On the other hand, the process of forming the DBF mark 230 in the S/L region (On S/L) and/or the cell region (On Cell) may be performed by using an EUV exposure process in a case where the mask 100 is a reflective mask. For example, the EUV exposure process may be performed by EUV light, the EUV light from a light source may be incident on an EUV mask through an illumination optical system, and light reflected from the EUV mask may be incident on a wafer through a projection optical system. The EUV light may have a wavelength of about 5 nm to about 20 nm. For example, in the EUV exposure process, the EUV light may have a wavelength of about 13 nm to about 14 nm. The EUV light may be generated through, e.g., plasma discharge. The plasma discharge may use laser plasma, discharged plasma, or high temperature plasma.

The illumination optical system may include, e.g., two or three mirrors. However, the number of mirrors of the illumination optical system is not limited to two or three. The illumination optical system may transfer the EUV light, transferred from the light source, to the EUV mask through reflections by using the mirrors. The illumination optical system may shape the EUV light into a curved slit shape and may irradiate the shaped EUV light onto the EUV mask. The projection optical system may include a plurality of mirrors. The projection optical system may include, e.g., four to eight mirrors. However, the number of mirrors of the projection optical system is not limited to four to eight. The projection optical system may transfer the light, reflected from the EUV mask, to the wafer 200 through reflections by using the mirrors.

A photoresist layer or an EUV resist layer may be formed on a wafer where a pattern is to be formed through an EUV exposure process. The photoresist layer, e.g., may be formed to have a thickness of about 200 nm to about 600 nm through a spin coating process. The photoresist layer may include a material having photosensitivity corresponding to DUV, EUV, or mid-ultraviolet (MUV) light, and particularly, may have a material having photosensitivity corresponding to EUV light. The photoresist layer may include, e.g., polymer hydroxy styrene. Also, the photoresist layer may include iodophenol additives. An inorganic material photoresist such as tin oxide may be formed to have a thin thickness and may be high in etch selectivity, and thus, a lower mask may also be formed to be thin, whereby the inorganic material photoresist may be used as a photoresist layer for an EUV exposure process. In the inorganic material photoresist, there may be a possibility that tin (Sn) remains in a target layer, and thus, the inorganic material photoresist may be controlled to 1 E11/cm$^3$ or less.

Referring to FIGS. 1, 5A, and 5B, a DBF mark 230 may be formed, and then, a measurement apparatus may measure the DBF mark 230 to monitor defocus in operation S140. The defocus monitoring may be performed by measuring diffracted light from the DBF mark 230.

In detail, in light reflected and diffracted (particularly, $\pm 1^{st}$-order diffracted light) through the DBF mark 230, a difference between the intensity of $+1^{st}$-order diffracted light and the intensity of $-1^{st}$-order diffracted light may vary based on the degree of defocus. Thus, when focus of light is in-focus in an exposure process, the intensity of $+1^{st}$-order diffracted light may be substantially the same as the intensity of $-1^{st}$-order diffracted light. On the other hand, when focus of light is out-of-focus in an exposure process, the intensity of $+1^{st}$-order diffracted light may differ from the intensity of $-1^{st}$-order diffracted light. Therefore, the measurement apparatus may measure a difference between the intensity of $+1^{st}$-order diffracted light and the intensity of $-1^{st}$-order diffracted light to measure and monitor defocus.

In FIG. 5A, upper photographs represent the intensity of a pupil surface. In FIG. 5A, lower photographs represent a difference between the intensity of $+1^{st}$-order diffracted light and the intensity of $-1^{st}$-order diffracted light (i.e., pupil delta (Δ)).

The pupil Δ is illustrated by light and shade on the basis of a difference between the intensity of $+1^{st}$-order diffracted light and the intensity of $-1^{st}$-order diffracted light. That is, a case where the pupil Δ is progressively deepened in color or shade (e.g., is darker) may correspond to a case where a difference between the intensity of $+1^{st}$-order diffracted light and the intensity of $-1^{st}$-order diffracted light is large.

Thus, in FIG. 5A, a difference between the intensity of $+1^{st}$-order diffracted light and the intensity of $-1^{st}$-order diffracted light is reduced in a direction from the left to the right. This may denote that a defocus size is reduced in the direction from the left to the right, and thus defocus gets closer to in-focus in the direction from the left to the right.

FIG. 5B is a graph showing pupil Δ with respect to a focus position. In the graph of FIG. 5B, the x axis represents a focus position, and 0 corresponds to an in-focus position. Also, the y axis represents an average pupil Δ.

At the in-focus position, the average pupil Δ may be 0, and namely, a difference between the intensity of $+1^{st}$-order diffracted light and the intensity of $-1^{st}$-order diffracted light may averagely correspond to 0. Also, in (−) defocus, the average pupil Δ may be represented as a (+) value, and in (+) defocus, the average pupil Δ may be represented as a (−) value. Since the pupil Δ is defined as subtracting of $-1^{st}$-order diffracted light from $+1^{st}$-order diffracted light or is defined as subtracting of $+1^{st}$-order diffracted light from $-1^{st}$-order diffracted light, signs may be opposite. Also, in FIG. 5B, a pupil Δ graph based on a focus position is a first-order graph and is shown in a linear line shape, but is not limited thereto and may be shown as a nonlinear curve such as a cubic graph.

The defocus measurement method according to an example embodiment may select a DBF mark suitable for defocus measurement, manufacture a mask having a marks pattern that is used to form the DBF mark, form the DBF mark in a cell region of a wafer by using the mask, and monitor defocus by measuring the DBF mark, thereby accurately measuring defocus of the cell region of the wafer in an exposure process. Also, as described with reference to FIGS. 6, 9A, and 9B, the defocus measurement method according to an example embodiment may sample and measure a DBF mark by regions, obtain defocus data of a corresponding region, extract appropriate correction recipe data corresponding the defocus data, and apply the extracted correction recipe data to an exposure process for the corresponding region, thereby precisely correcting defocus of the corresponding region. Thus, a yield rate of products may be considerably improved.

Also, the defocus measurement method according to an example embodiment may measure defocus by using tens of thousands to millions of DBF marks formed in a cell region of a wafer, and thus, may accurately measure defocus of the cell region of the wafer and may very precisely perform defocus correction accordingly. For example, the defocus measurement method according to an example embodiment may accurately obtain defocus-related data of a cell region of a wafer, and then, a defocus correction method may extract correction recipe data having a cubic curve shape on the basis of the defocus-related data, and may more precisely perform defocus correction by using the extracted correction recipe data in defocus correction.

For reference, in the general defocus measurement method, because defocus is measured by using tens of DBF marks formed in only an S/L region, defocus-related data may be mainly represented as a first-order graph having a rectilinear shape and may be low in accuracy, and when the step height variation occurs between the S/L region and the cell region, there is high possibility that an error of defocus measurement may occur. In the case where defocus is corrected based on the general defocus measurement method, because correction recipe data is extracted in a first-order rectilinear shape, an accuracy of defocus correction may be low and, moreover, there is high possibility that defocus may be abnormally corrected or miscorrected due to an error of defocus measurement.

On the other hand, in a defocus measurement method according to an example embodiment, defocus may be measured by using tens of thousands to millions of DBF marks formed in a cell region of a wafer, thereby improving the defocus measurement method and improving the correction.

Figure 6:
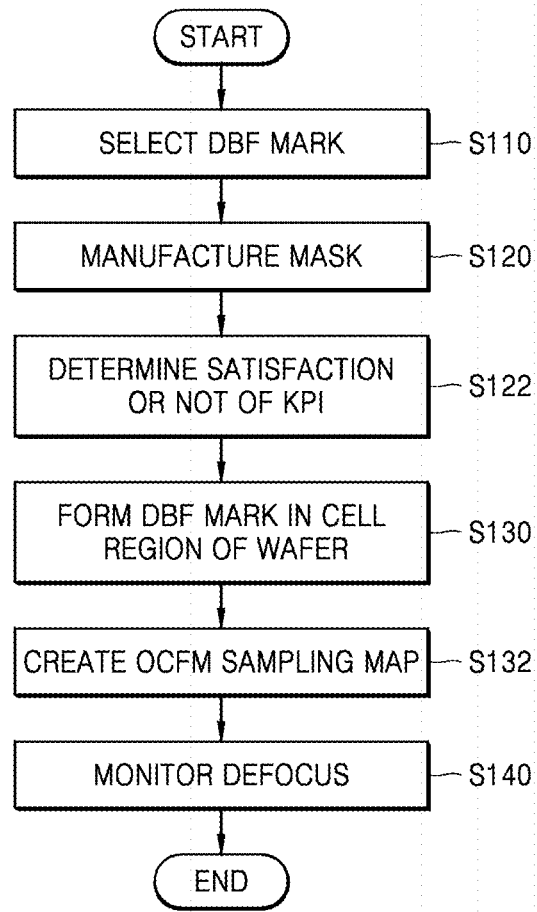
FIG. 6 is a flowchart schematically illustrating a defocus measurement method according to an example embodiment.
Figure 7:
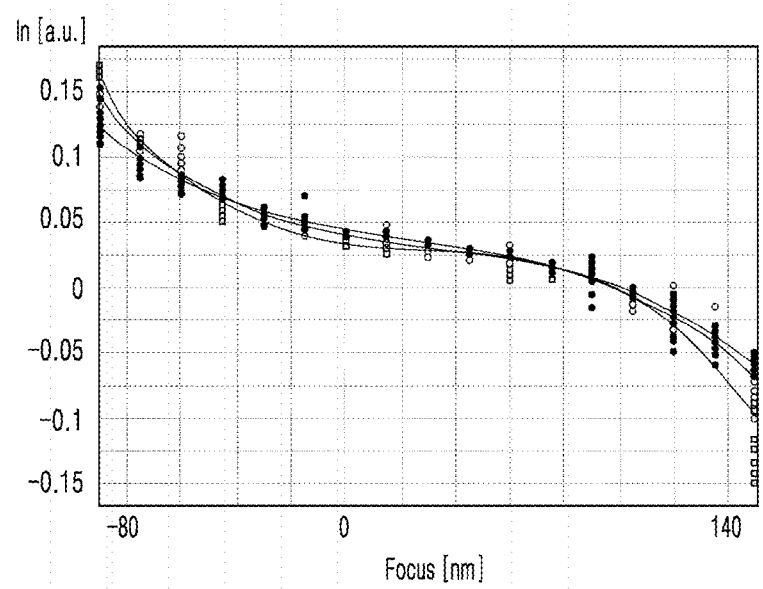
FIG. 7 is a graph for describing an operation of determining the satisfaction or not of a key parameter index (KPI), in the defocus measurement method of FIG. 6.
Figure 8:
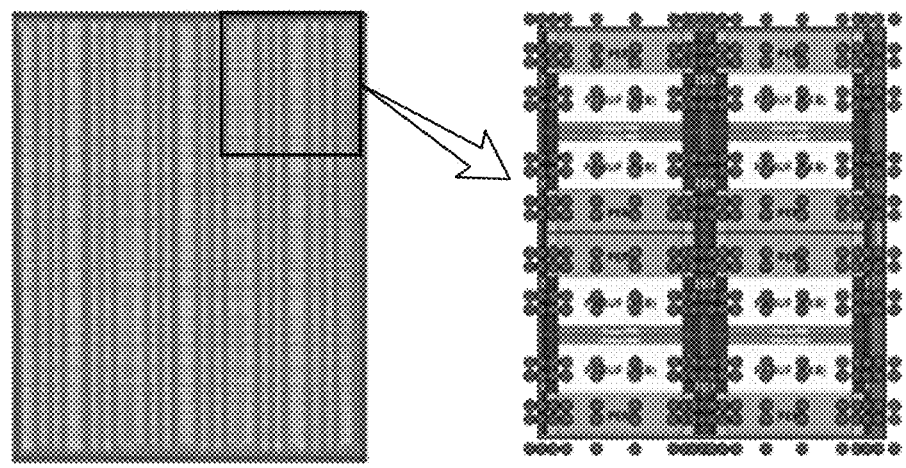
FIG. 8 shows photographs for describing an operation of creating an on cell focus monitoring (OCFM) sampling map, in the defocus measurement method of FIG. 6.

FIG. 6 is a flowchart schematically illustrating a defocus measurement method according to an example embodiment. FIG. 7 is a graph for describing an operation of determining the satisfaction or not of a key parameter index (KPI), in the defocus measurement method of FIG. 6. FIG. 8 shows photographs for describing an operation of creating an OCFM sampling map, in the defocus measurement method of FIG. 6. Descriptions, which are the same as or similar to descriptions given above with reference to FIGS. 1 to 5B, will be briefly given below or are omitted.

Referring to FIGS. 6 to 8, the defocus measurement method according to an example embodiment may further include operation S122 of determining the satisfaction or not of a KPI after operation S120 of manufacturing a mask, and operation S132 of creating an OCFM sampling map after operation S130 of forming a DBF mark, and thus, may differ from the defocus measurement method of FIG. 1.

In detail, the defocus measurement method according to the present example embodiment may sequentially perform operation S110 of selecting a DBF mark and operation S120 of manufacturing a mask. Operation S110 of selecting the DBF mark and operation S120 of manufacturing the mask are as described above with reference to FIGS. 1 to 3C.

Subsequently, in operation S122, whether the manufactured mask satisfies the KPI may be determined. Here, the KPI may be an evaluation criterion for determining whether the manufactured mask is appropriate for forming a desired DBF. For example, the KPI may include a workable focus range, dose crosstalk (Xtalk), dynamic precision, and setget residual. An operation of determining the satisfaction or not of the KPI may be made by forming a DBF mark by applying the manufactured mask to a wafer, e.g., a test wafer, and by measuring and determining the DBF mark by using a measurement apparatus.

Here, the workable focus range may be determined based on whether an intensity graph is linear within a certain focus range. For example, the graph of FIG. 7 is a graph showing intensity based on a focus position, the x axis represents a focus position within a range of −90 nm to +150 nm (i.e., a range of 240 nm), and they axis represents intensity and a unit is an arbitrary unit. In the graph of FIG. 7, it may be seen that a graph is roughly linear. Therefore, when an evaluation criterion of a workable focus range is about 240 nm, it may be determined that an evaluated mask satisfies the workable focus range. According to embodiments, in an operation of verifying the workable focus range, a focus position may be within a range of −120 nm to +120 nm.

Dose Xtalk may be determined as the degree of influence based on a dose, and when dose Xtalk is determined to be less than an evaluation criterion, it may be determined that an evaluated mask satisfies dose Xtalk. In FIG. 7, by using three kinds of doses, intensities at a plurality of positions of a mask based on a focus position are represented by dots. Also, three lines may correspond to a fitting line which connects averages of intensities at a plurality of positions based on a focus position, based on three kinds of doses. Through the graph of FIG. 7, it may be seen that the evaluated mask is not greatly affected by a dose.

Dynamic precision is relevant to reproducibility, and in a case where a DBF mark is repeatedly formed by using a corresponding mask, a value of a distribution may be determined. When a distribution is less than a criterion, it may be determined that the corresponding mask satisfies dynamic precision. Setget residual may be determined as a difference between input focus and output focus, and may be better as a value thereof is reduced. According to embodiments, the KPI may further include an evaluation criterion in addition to the evaluation criterions described above, or at least one of the criterions may be omitted or may be replaced with another evaluation criterion.

After operation S122 of determining the satisfaction or not of the KPI, in operation S130, a DBF mark may be formed in a cell region of a wafer by using a mask for which the KPI has been verified. Operation S130 of forming the DBF mark is as described above with reference to FIGS. 1 and 4A to 4C.

After operation S130 of forming the DBF mark, an OCFM sampling map may be created in operation S124. For example, a DBF mark may be formed in a cell region of a wafer, and then, a measurement apparatus may measure the DBF mark to create a defocus measurement map. Also, because tens of thousands to millions of DBF marks may be provided per shot, performing defocus measurement on all DBF marks of a wafer may not be efficient in terms of time. Therefore, sampling may be performed by positions of a wafer and by subdivided regions of a cell region, and thus, a defocus measurement map may be created. For example, a defocus measurement map may be created by performing sampling by shot regions of a wafer, or a defocus measurement map may be created by performing dividing and sampling by an edge region and a center region of a wafer. Also, a region corresponding to one shot may be subdivided into a memory cell region, a peri region, an extension region, and a (X-dec) region, and thus, by performing sampling by sub-regions, a defocus measurement map may be created. Also, in a case where a DBF mark is formed in an S/L region, a defocus measurement map may be created by performing sampling on the S/L region.

For reference, chips included in an edge region of a wafer may show an abnormal result relative to chips of a center region, in association with defocus. This is because there is higher possibility that a step height variation between the S/L region and the cell region may occur in the edge region.

In general, defocus of chips of the edge region may not be accurately determined based on only measurement using a DBF mark disposed in the S/L region, and thus, in a general method, there may be a limitation where a defocus error of the chips of the edge region is uncorrectable.

Given the limitations of the general method, in the chips of the edge region of the wafer, it may be desirable to directly measure defocus of the cell region, and to correct defocus on the basis of a result of the direct measurement of defocus.

In the defocus measurement method according to the present example embodiment, an operation of performing sampling to create a defocus measurement map may denote that a defocus measurement map is created in a region where a number of defocus errors occur, namely, a region where defocus monitoring and defocus correction based thereon are needed. Therefore, in the defocus measurement method according to the present example embodiment, a defocus measurement map created by sampling a region requiring correction or a region which is to be corrected may be referred to as an OCFM sampling map. Defocus measurement of a corresponding region may be accurately and quickly performed by creating an OCFM sampling map, and moreover, defocus correction of the corresponding region may be more precisely performed. Here, defocus correction being precisely performed may be a concept which measures a number of DBF marks in a corresponding region on the basis of an OCFM sampling map, obtains defocus-related data in third or higher-order curve shapes, and corrects defocus, and moreover, may denote that the amount of correction is maximized, in terms of the amount of correction. Correction of defocus will be described in more detail with reference to FIGS. 9A to 11B.

FIG. 8 shows an OCFM sampling map. The OCFM sampling map of FIG. 8 may optionally include a plurality of DBF marks which are to be measured in a region corresponding to one left shot. For example, dots marked in a right enlarged photograph may correspond to DBF marks which are to be measured in a cell region. For reference, the right enlarged photograph of FIG. 8 may correspond to a portion (for example, one chip) marked as a box in the one left shot, and the dots may be a plurality of DBF marks disposed in a memory cell region.

Figure 9A:
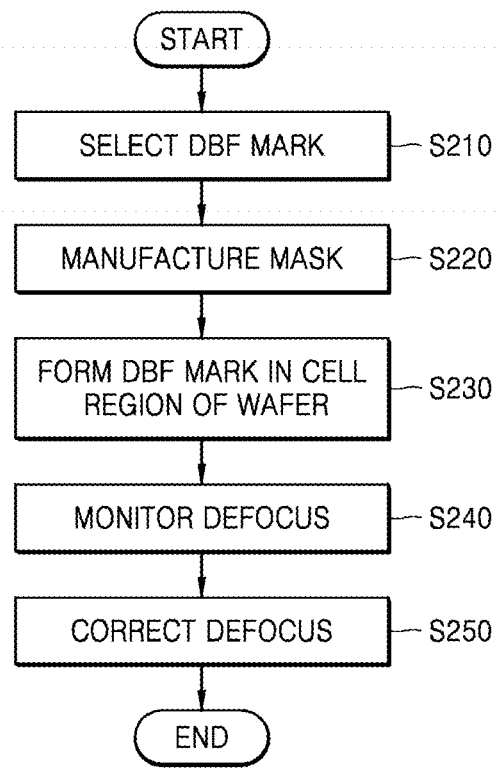
FIGS. 9A and 9B are flowcharts schematically illustrating a defocus correction method according to embodiments.
Figure 9B:
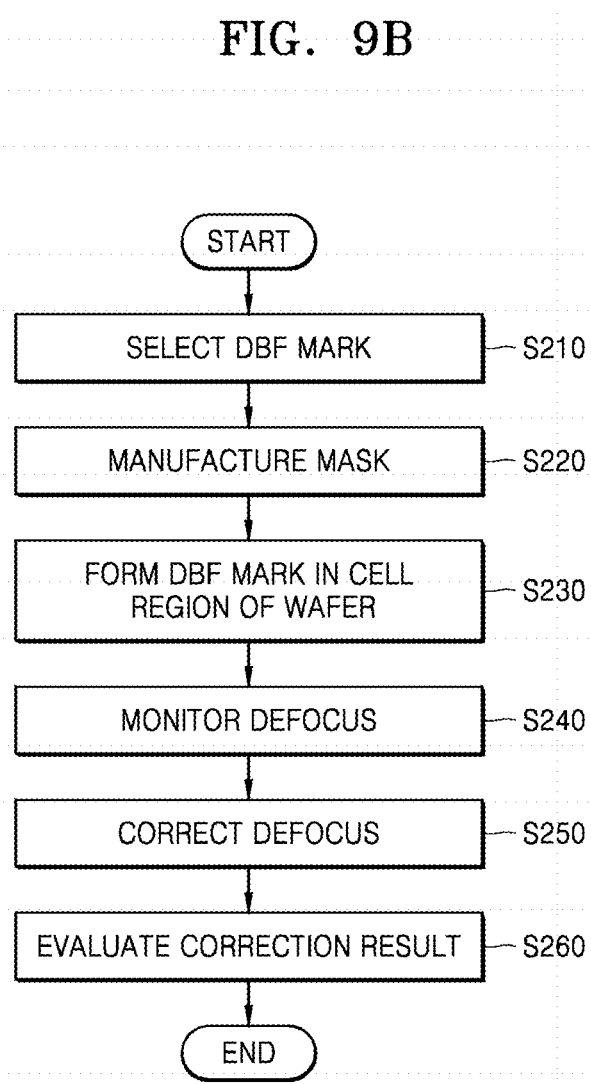

FIGS. 9A and 9B are flowcharts schematically illustrating a defocus correction method according to embodiments. Descriptions, which are the same as or similar to descriptions given above with reference to FIGS. 1 to 8, will be briefly given below or are omitted.

Referring to FIG. 9A, a defocus correction method according to the present example embodiment may sequentially perform up to operation S240 of monitoring defocus from operation S210 of selecting a DBF mark. Operations up to operation S240 of monitoring defocus from operation S210 of selecting a DBF mark are the same as operations up to operation S140 of monitoring defocus from operation S110 of selecting a DBF mark, described above with reference to FIGS. 1 to 5B.

After operation S240 of monitoring defocus, in operation S250, defocus may be corrected based on a monitoring result of operation S240 of monitoring defocus. Defocus being corrected may denote that a defocus state is corrected to an in-focus state in an exposure process.

In the defocus correction method according to the present example embodiment, a method of correcting defocus may include, e.g., a method of inputting a defocus size opposite to a measured defocus size. However, the method of correcting defocus is not limited thereto. For example, the method of correcting defocus may include a method of adjusting focus and a method of adjusting a dose or an incident angle of light. The method of correcting defocus will be described in more detail with reference to FIGS. 10A to 11B.

Referring to FIG. 9B, a defocus correction method according to the present example embodiment may further include operation S260 of evaluating a correction result after operation S250 of correcting defocus, and thus, may differ from the defocus correction method of FIG. 9A.

In detail, the defocus correction method according to the present example embodiment may sequentially perform up to operation S250 of correcting defocus from operation S210 of selecting a DBF mark. Operations up to operation S250 of correcting defocus from operation S210 of selecting a DBF mark are as described above with reference to FIG. 9A.

After operation S250 of correcting defocus, in operation S260, a correction result of defocus may be evaluated.

Evaluation of a correction result may include evaluation of a focus correction per exposure (CPE) result and evaluation of consistency of a pattern of a wafer. Here, the focus CPE result may denote an improvement result of defocus by defocus correction. Also, the consistency of the pattern of the wafer may denote the degree to which a formed pattern matches a desired reference pattern, in forming a real pattern on the wafer after defocus correction. Operation S260 of evaluating a correction result will be described in more detail with reference to FIGS. 12A to 13B.

As illustrated in FIGS. 9A and 9B, in the defocus correction method according to the present example embodiment, operation S230 of forming a DBF mark and operation S240 of monitoring defocus may be performed after operation S220 of manufacturing a mask, and then, operation S250 of correcting defocus may be performed. However, embodiments are not limited thereto, and as in the defocus measurement method of FIG. 6, the defocus correction method according to the present example embodiment may further include an operation of determining the satisfaction or not of a KPI and an operation of creating an OCFM sampling map. For example, an operation of determining the satisfaction or not of a KPI may be performed after operation S220 of manufacturing a mask, and an operation of creating an OCFM sampling map may be performed after operation S230 of forming a DBF mark. Subsequently, operation S240 of monitoring defocus may be performed.

Figure 10A:
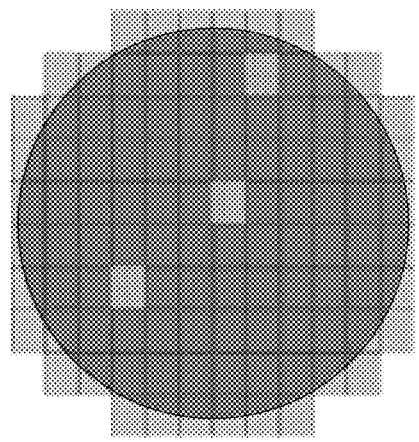
FIGS. 10A to 10C are photographs for describing an operation of monitoring defocus, in the defocus correction method of FIG. 9A or 9B.
Figure 10B:
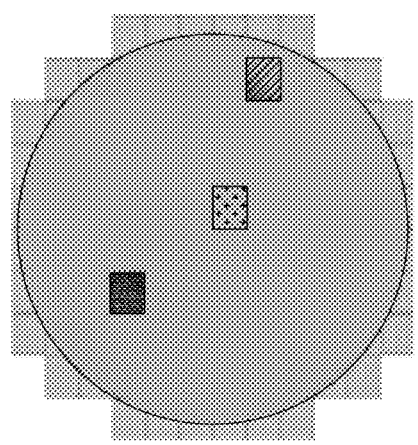
Figure 10C:
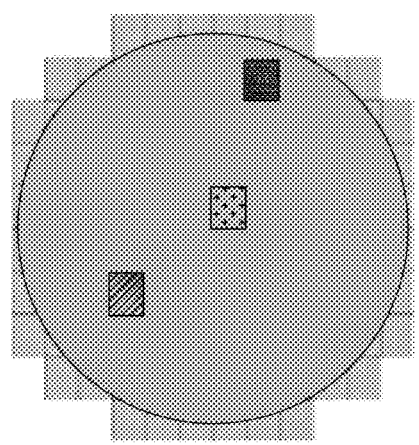

FIGS. 10A to 10C are photographs for describing an operation of monitoring defocus, in the defocus correction method of FIG. 9A or 9B. Descriptions, which are the same as or similar to descriptions given above with reference to FIG. 9A or 9B, will be briefly given below or are omitted.

Referring to FIGS. 10A to 10C, FIG. 10A conceptually shows a shape where data of defocus is obtained through measurement and may be included in operation S240 of monitoring defocus, in the defocus correction method of FIG. 9A or 9B. In operation S240 of monitoring defocus, defocus monitoring may be performed based on an OCFM sampling map. For example, measurement and monitoring of defocus may be performed based on an OCFM sampling map sampled for each shot region. In FIG. 10A, it is illustrated that measurement and monitoring of defocus are performed on three shot regions. Data of defocus of corresponding regions may be obtained through measurement and monitoring of defocus.

FIG. 10B conceptually shows a shape where fingerprint data is obtained through fitting on the basis of data of defocus obtained in FIG. 10A and may be included in operation S240 of monitoring defocus, in the defocus correction method of FIG. 9A or 9B. The fingerprint data may be shown with a size of defocus corresponding to a position and may include a first or higher-order graph. For example, the fingerprint data may include a first-order or third-order graph. However, the fingerprint data is not limited to the first-order or third-order graph. The fingerprint data will be described in more detail with reference to FIG. 11A.

FIG. 10C conceptually shows a shape where correction recipe data is extracted based on fingerprint data obtained in FIG. 10B and may be included in operation S240 of monitoring defocus, in the defocus correction method of FIG. 9A or 9B. The correction recipe data may be extracted by inversely using the fingerprint data. Thus, in fingerprint data shown with a size of defocus corresponding to a position, the correction recipe data may be extracted by oppositely using a size of defocus with reference to an in-focus position. The correction recipe data will be described in more detail with reference to FIG. 11B.

Figure 11A:
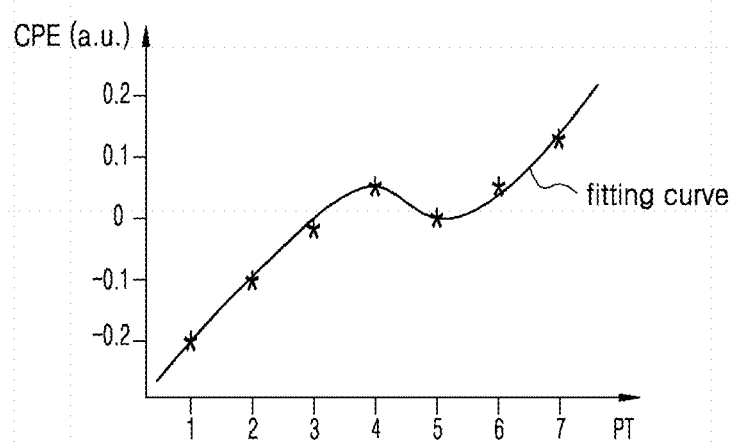
FIGS. 11A and 11B are graphs describing in more detail an operation of monitoring defocus and an operation of correcting defocus, in the defocus correction method of FIG. 9A or 9B.
Figure 11B:
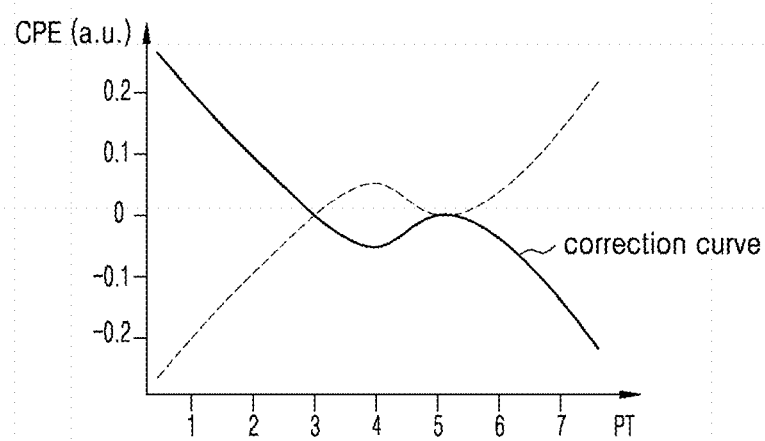

FIGS. 11A and 11B are graphs describing in more detail an operation of monitoring defocus and an operation of correcting defocus, in the defocus correction method of FIG. 9A or 9B. Descriptions, which are the same as or similar to descriptions given above with reference to FIG. 9A or 9B and 10A to 10C, will be briefly given below or are omitted.

Referring to FIG. 11A, FIG. 11A is a graph showing a size of defocus with respect to a position and may correspond to fingerprint data. In the graph of FIG. 11A, the x axis represents a measured position or a point of a DBF mark. Also, the y axis represents a size of defocus, a unit is an arbitrary unit, and 0 may correspond to an in-focus position. A graph of fingerprint data of FIG. 11A may be obtained by measuring a DBF mark for each point, detecting a size of defocus, displaying the detected size of defocus on the graph, and finding an optimal curve graph through fitting. Point-based measurement of the DBF mark may be performed based on an OCFM sampling map.

Referring to FIG. 11B, FIG. 11B is a graph showing the amount of correction of defocus with respect to a position and may correspond to correction recipe data. In the graph of FIG. 11B, the x axis represents a measured position or a point of a DBF mark. Also, the y axis represents a size of defocus or the amount of correction of defocus, a unit is an arbitrary unit, and 0 may correspond to an in-focus position. For convenience of understanding, in the graph of FIG. 11B, the fingerprint data of FIG. 11A is illustrated as a dashed-line graph.

A graph of the correction recipe data of FIG. 11B may be obtained by inversely applying the fingerprint data with respect to the in-focus position. Thus, with respect to the in-focus position, the correction recipe data may be extracted by setting the amount of correction of defocus to have a size opposite to a size of defocus of the fingerprint data. Thus, the correction recipe data may be symmetrical with the fingerprint data with respect to the in-focus position.

As described above, when the correction recipe data is obtained, defocus may be accurately and quickly corrected by applying the correction recipe data to an exposure process, in forming a real pattern of a wafer subsequently. Also, correction recipe data of a region requiring defocus correction may be fed back to a corresponding semiconductor device manufacturing process, thereby improving a yield rate and reducing a time and a schedule for developing a corresponding semiconductor device. In terms of a step height variation between an S/L region and a cell region, a region requiring defocus correction may be referred to as a region requiring improvement of a step height.

Figure 12A:
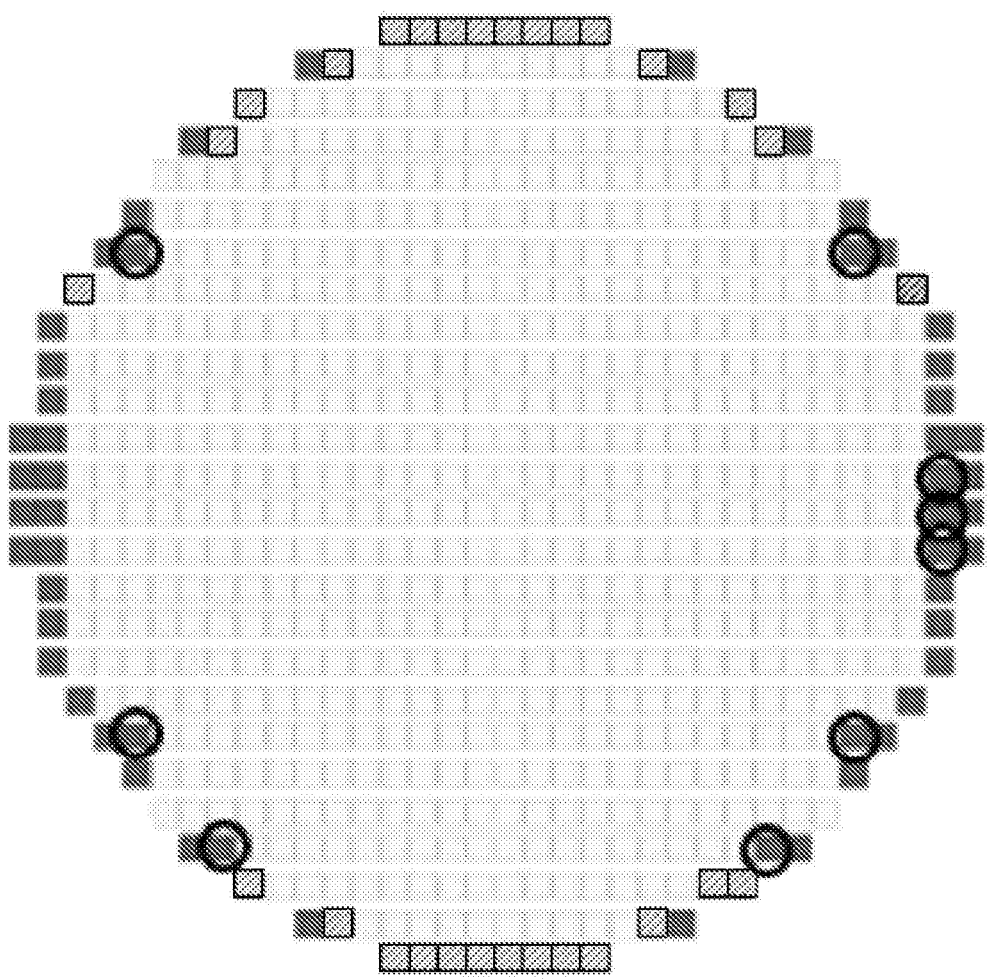
FIGS. 12A to 13B are photographs describing in more detail an operation of evaluating a correction result, in the defocus correction method of FIG. 9B.
Figure 12B:
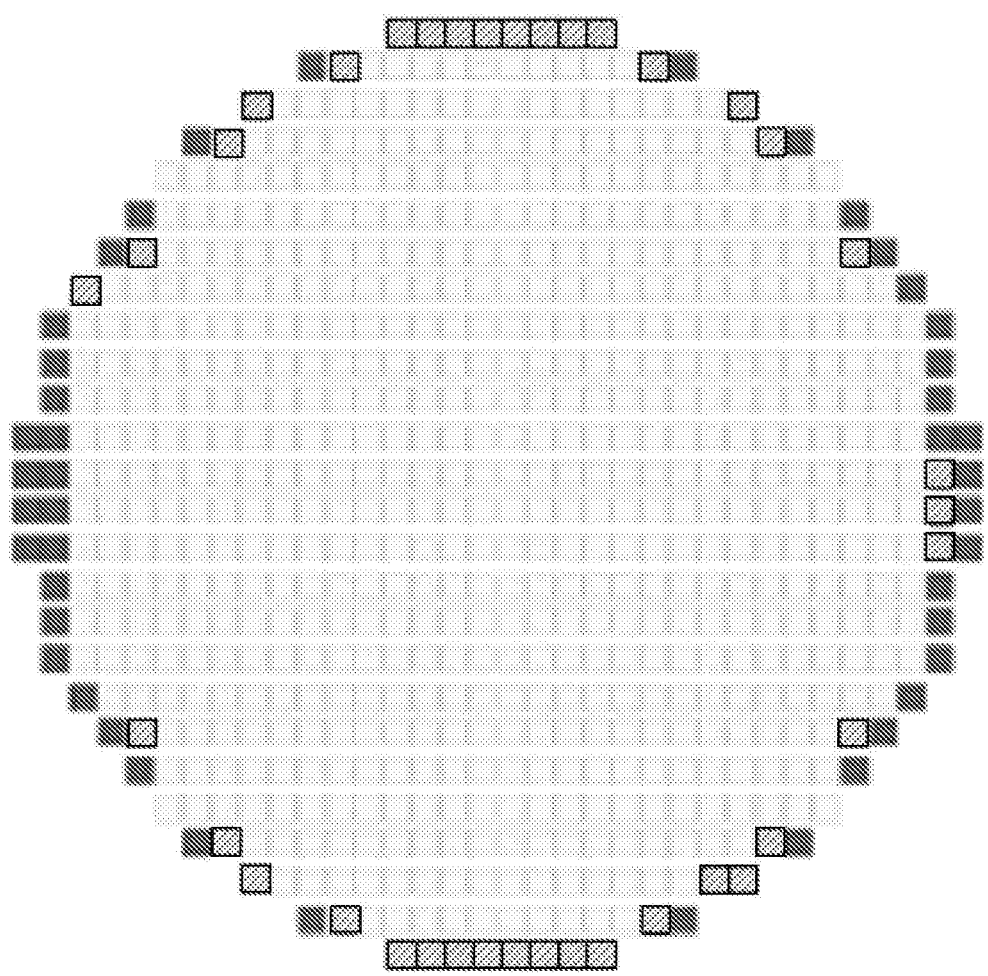
Figure 13A:
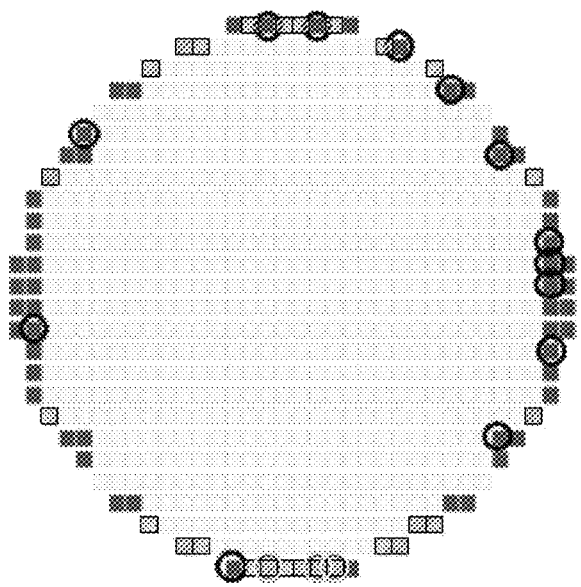
Figure 13B:
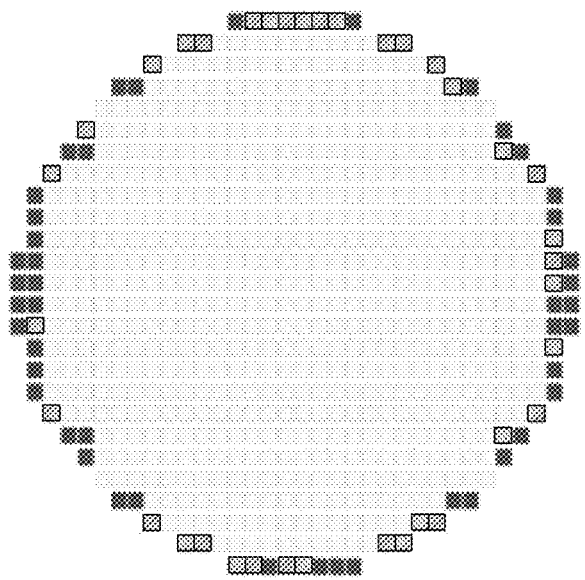

FIGS. 12A to 13B are photographs describing in more detail an operation of evaluating a correction result, in the defocus correction method of FIG. 9B. FIGS. 12A and 12B are photographs relevant to evaluation of a focus CPE result, and FIGS. 13A and 13B are photographs relevant to evaluation of consistency of a pattern of a wafer.

Referring to FIGS. 12A and 12B, when a reference defocus range is about −40 nm to about +40 nm, FIG. 12A is a photograph of a wafer showing chips differentiated from one another outside the reference defocus range before defocus correction, and FIG. 12B is a photograph of a wafer showing chips differentiated from one another outside the reference defocus range after defocus is corrected by the defocus correction method according to the present example embodiment. For reference, evaluation of a focus CPE result may be performed on chips at an edge of a wafer, and in FIGS. 12A and 12B, defective chips outside the reference defocus range are differentiated from good chips within the reference defocus range by using light and shade. That is, dark-colored chips may be defective chips, and light-colored chips may be good chips. Also, in FIG. 12A, chips obtained by effectively changing defective chips to good chips through the defocus correction method according to the present example embodiment are illustrated by a small circle.

In terms of numerical calculation, it may be confirmed that, before defocus correction, 53 defective chips of an edge are detected in FIG. 12A, and as nine chips illustrated by a small circle are changed to good chips after defocus correction, 44 defective chips of an edge are detected in FIG. 12B. Therefore, based on the defocus correction method according to the present example embodiment, it may be confirmed that the focus CPE result is improved by "$\%_{53}*100=17.0\%$".

Furthermore, in a case where a focus CPE result of the defocus correction method of the related art and a focus CPE result of the defocus correction method according to the present example embodiment are evaluated based on 3 sigma (3 σ), it may be confirmed that, in the defocus correction method of the related art, because 3 σ is 72.0 before correction and is changed to 73.6 after correction, a degradation "$(73.6−72.0)/72.0*100=2.2\%$" occurs, but in the defocus correction method according to the present example embodiment, because 3 σ is 72.0 before correction and is changed to 71.2 after correction, 3 σ is improved by "$(72.0−71.2)/72.0*100=1.1\%$".

Referring to FIGS. 13A and 13B, when a reference critical dimension (CD) of a pattern of a wafer is about 88.8 nm, FIG. 13A is a photograph of a wafer where chips, where a CD of a pattern is greater than the reference CD, are differentiated from one another and shown before defocus correction, and FIG. 13B is a photograph of a wafer where chips, where a CD of a pattern is greater than the reference CD, are differentiated from one another and shown after defocus is corrected through the defocus correction method according to the present example embodiment. For reference, evaluation of consistency of a pattern of a wafer may be performed on chips at an edge of the wafer, and in FIGS. 13A and 13B, defective chips where a CD of a pattern is greater than the reference CD and good chips where a CD of a pattern is less than or equal to the reference CD are differentiated from one another by using light and shade. That is, dark-colored chips may be defective chips, and light-colored chips may be good chips.

Also, in FIG. 13A, chips obtained by changing defective chips to good chips through the defocus correction method according to the present example embodiment are illustrated by a small circle. In terms of numerical calculation, it may be confirmed that, before defocus correction, 55 defective chips of an edge are detected in FIG. 13A, and as 10 chips illustrated by a small circle are changed to good chips after defocus correction, 45 defective chips of an edge are detected in FIG. 13B. Therefore, based on the defocus correction method according to the present example embodiment, it may be confirmed that consistency of a pattern of a wafer is improved by "10/55*100=18.2%".

For reference, in FIG. 13A, small circles may include 13 dark circles and three white circles, the dark circles may denote chips obtained by effectively changing defective chips to good chips, and the white circles may denote chips obtained by changing good chips to defective chips. Therefore, when three good chips changed from defective chips are removed by using three defective chips changed to good chips, it may be seen that an additional 10 good chips are obtained.

Thus, it may be confirmed that the defocus correction method according to the present example embodiment shows a high improvement rate of 15% or more, in evaluation of consistency of a pattern and a focus CPE result.

Figure 14:
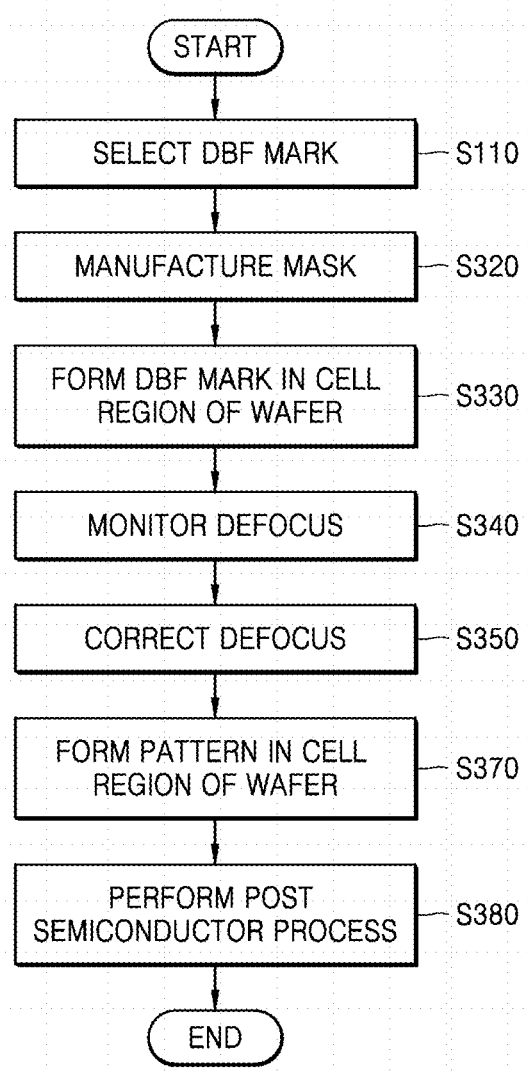
FIG. 14 is a flowchart schematically illustrating a method of manufacturing a semiconductor device by using a defocus correction method, according to an example embodiment.

FIG. 14 is a flowchart schematically illustrating a method of manufacturing a semiconductor device by using a defocus correction method, according to an example embodiment. Descriptions, which are the same as or similar to descriptions given above with reference to FIG. 9A or 9B, will be briefly given below or are omitted.

Referring to FIG. 14, a method of manufacturing a semiconductor device (hereinafter simply referred to as a semiconductor device manufacturing method) by using the defocus correction method according to the present example embodiment may sequentially perform up to operation S350 of correcting defocus from operation S310 of selecting a DBF mark. Operations up to operation S350 of correcting defocus from operation S310 of selecting the DBF mark are the same as operations up to operation S250 of correcting defocus from operation S210 of selecting the DBF mark, described above with reference to FIG. 9A.

According to embodiments, the semiconductor device manufacturing method according to the present example embodiment may further include an operation of determining the satisfaction or not of a KPI and an operation of creating an OCFM sampling map. For example, an operation of determining the satisfaction or not of a KPI may be performed after operation S320 of manufacturing a mask, and an operation of creating an OCFM sampling map may be performed after operation S330 of forming a DBF mark. Subsequently, operation S340 of monitoring defocus may be performed. Also, as in the defocus correction method of FIG. 9B, the semiconductor device manufacturing method according to the present example embodiment may further include an operation of evaluating a correction result after operation S350 of correcting defocus.

After operation S350 of correcting defocus or an operation of evaluating the correction result, in operation S370, a pattern in a cell region of a wafer may be formed.

The operation of forming the pattern in the cell region may be performed through an exposure process to which defocus correction in operation S350 of correcting defocus is applied. Also, defocus correction may be selectively and precisely performed on regions requiring or desiring correction on the basis of an OCFM sampling map, and a pattern may be formed in a cell region through an exposure process to which precise defocus correction is applied. When a pattern is formed on a cell region of a wafer including DFB marks, DBF marks on the cell region may be removed before a pattern is formed.

The operation of forming the pattern in the cell region may be performed through a UV or DUV exposure process or a EUV exposure process. For example, when a mask for forming a DBF mark is a transmissive mask for the UV or DUV exposure process, the operation of forming the pattern in the cell region may be performed through the UV or DUV exposure process by using a transmissive mask for forming a pattern. Also, when a mask for forming a DBF mark is a reflective mask for the EUV exposure process, the operation of forming the pattern in the cell region may be performed through the EUV exposure process by using a reflective mask for forming a pattern.

After operation S370 of forming the pattern in the cell region, in operation S380, a post semiconductor process may be performed on the wafer.

A plurality of semiconductor devices may be manufactured from the wafer through the post semiconductor process performed on the wafer. The post semiconductor process performed on the wafer may include various processes. For example, the post semiconductor process performed on the wafer may include a deposition process, an etching process, an ion process, and a cleaning process. When an exposure process is included in the etching process of the post semiconductor process, the defocus measurement method and/or the defocus correction method according to the present example embodiment may be applied to the exposure again.

The post semiconductor process performed on the wafer may include a test process of a semiconductor device of a wafer level. Furthermore, the post semiconductor process performed on the wafer may include an operation of individualizing or dicing the wafer into semiconductor chips and a process of packaging the semiconductor chips. Here, the process of packaging the semiconductor chips may denote a process of mounting the semiconductor chips on a printed circuit board (PCB) and sealing the semiconductor chips with a sealant, and may include a process of stacking a plurality of semiconductors on the PCB in a multi-layer structure to form a stack package or a process of stacking a stack package on a stack package to form a package on package (POP) structure. A semiconductor device or a semiconductor package may be finished through the process of packaging the semiconductor chips.

By way of summation and review, as a degree of integration of semiconductor devices increases, a critical dimension (CD) of a photoresist pattern may be increasingly reduced. In order to enhance CD uniformity of a photoresist pattern having a fine CD, it is desired to precisely and reliably measure a lithography process (for example, an exposure process).

As described above, embodiments may provide a defocus measurement method and a correction method, which accurately measure defocus and precisely correct defocus in an exposure process, and a method of manufacturing a semiconductor device by using the correction method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A defocus measurement method, comprising:
   selecting a diffraction based focus (DBF) mark that is unaffected by a pattern of a lower layer;

manufacturing a mask including a mark pattern for forming the DBF mark;

forming the DBF mark in a cell region of a wafer by using the mask, the wafer including memory cells and/or logic cells in the cell region and a scribe lane region outside the cell region; and measuring the DBF mark and monitoring defocus.

2. The defocus measurement method as claimed in claim 1, wherein:

the cell region is a region of the wafer where a real pattern is formed, the cell region having a step height variation with respect to the scribe lane region during measuring of the DBF mark, the manufacturing of the mask includes forming tens of thousands to millions of mark patterns on the mask, and the forming of the DBF mark includes transferring the mark patterns to the cell region to form corresponding DBF marks, through an exposure process, a total number of the corresponding DBF marks in the cell region being larger than a total number of DBF marks in the scribe lane region.

3. The defocus measurement method as claimed in claim 1, further comprising:

before the forming of the DBF mark, determining whether the mask, which includes the mark pattern, satisfies a key parameter index (KPI); and before the monitoring of the defocus, creating an on-cell focus monitoring (OCFM) sampling map, wherein the monitoring of the defocus includes monitoring defocus of a corresponding region of the wafer on the basis of the OCFM sampling map.

4. The defocus measurement method as claimed in claim 3, wherein the creating of the OCFM sampling map includes dividing the wafer into a memory cell region, a peri region, an extension region, a row-decoder region, and the scribe lane region to create the OCFM sampling map.

5. The defocus measurement method as claimed in claim 1, wherein the monitoring of the defocus includes obtaining fingerprint data through fitting on the basis of data of the defocus.

6. The defocus measurement method as claimed in claim 5, wherein the fingerprint data includes a first- or higher-order graph.

7. The defocus measurement method as claimed in claim 1, wherein the mask is a general-use mask capable of being used in at least two different exposure processes.

8. The defocus measurement method as claimed in claim 1, wherein the mask is a reflective mask used for an extreme ultraviolet (EUV) exposure process, and the forming of the DBF mark includes forming the DBF mark through the EUV exposure process.

9. A defocus correction method, comprising:

selecting a diffraction based focus (DBF) mark that is unaffected by a pattern of a lower layer;

manufacturing a mask including a mark pattern for forming the DBF mark;

forming the DBF mark in a cell region of a wafer by using the mask, the wafer including memory cells and/or logic cells in the cell region and a scribe lane region outside the cell region;

measuring the DBF mark and monitoring defocus; and correcting the defocus on the basis of a result of the monitoring.

10. The defocus correction method as claimed in claim 9, wherein:

the cell region is a region of the wafer where a real pattern is formed, the manufacturing of the mask includes forming tens of thousands to millions of mark patterns on the mask, and the forming of the DBF mark includes transferring the mark patterns to the cell region to form corresponding DBF marks, through an exposure process.

11. The defocus correction method as claimed in claim 9, further comprising:

before the forming of the DBF mark, determining whether the mask, which includes the mark pattern, satisfies a key parameter index (KPI); and before the monitoring of the defocus, creating an on-cell focus monitoring (OCFM) sampling map, wherein the monitoring of the defocus includes monitoring defocus of a corresponding region on the basis of the OCFM sampling map.

12. The defocus correction method as claimed in claim 9, wherein:

the monitoring of the defocus includes obtaining fingerprint data through fitting on the basis of data of the defocus, and the fingerprint data includes a first- or higher-order graph.

13. The defocus correction method as claimed in claim 12, wherein:

the monitoring of the defocus includes extracting correction recipe data on the basis of the fingerprint data, and the correcting of the defocus includes performing correction on the basis of the correction recipe data.

14. The defocus correction method as claimed in claim 9, further comprising, after the correcting of the defocus, evaluating a correction result.

15. The defocus correction method as claimed in claim 14, wherein the evaluating of the correction result includes evaluating of a focus correction per exposure (CPE) result and consistency of a pattern of the wafer.

16. A method of manufacturing a semiconductor device, the method comprising:

selecting a diffraction based focus (DBF) mark that is unaffected by a pattern of a lower layer;

manufacturing a mask including a mark pattern for forming the DBF mark;

forming the DBF mark in a cell region of a wafer by using the mask, the wafer including memory cells and/or logic cells in the cell region and a scribe lane region outside the cell region;

measuring the DBF mark and monitoring defocus;

correcting the defocus on the basis of a result of the monitoring; and forming a pattern in the cell region of the wafer, after correcting the defocus.

17. The method as claimed in claim 16, wherein:

the manufacturing of the mask includes forming tens of thousands to millions of mark patterns on the mask, and the forming of the DBF mark includes transferring the mark patterns to the cell region to form corresponding DBF marks, through an exposure process.

18. The method as claimed in claim 16, further comprising:

before the forming of the DBF mark, determining whether the mask, which includes the mark pattern, satisfies a key parameter index (KPI); and before the monitoring of the defocus, creating an on-cell focus monitoring (OCFM) sampling map, wherein the monitoring of the defocus includes monitoring defocus of a corresponding region on the basis of the OCFM sampling map.

19. The method as claimed in claim 16, wherein:
the monitoring of the defocus includes obtaining fingerprint data through fitting on the basis of data of the defocus, and extracting correction recipe data on the basis of the fingerprint data,
the fingerprint data includes a first or higher-order graph, and
the correcting of the defocus includes performing correction on the basis of the correction recipe data.

20. The method as claimed in claim 16, further comprising, after the correcting of the defocus, evaluating a correction result,
wherein the evaluating of the correction result includes evaluating of a focus correction per exposure (CPE) result and consistency of a pattern of the wafer, and feeding back information about a region of the wafer, for which defocus correction is to be applied, to a corresponding process of manufacturing a semiconductor device on the basis of the evaluation.

* * * * *